United States Patent [19]

Tkaczyk

[11] Patent Number: 5,480,728
[45] Date of Patent: Jan. 2, 1996

[54] LOW RESISTANCE ELECTRICAL CONTACT FOR OXIDE SUPERCONDUCTORS AND A METHOD FOR MAKING

[75] Inventor: John E. Tkaczyk, Delanson, N.Y.

[73] Assignee: General Electric Company, Schenectady, N.Y.

[21] Appl. No.: 176,179

[22] Filed: Jan. 3, 1994

[51] Int. Cl.⁶ .................................................. B22F 7/02
[52] U.S. Cl. ......................... 428/548; 428/546; 428/551; 428/553; 505/823; 419/6; 419/9; 419/20; 419/21; 419/22; 419/36
[58] Field of Search ........................... 505/1, 823; 419/6, 419/9, 20, 21, 22, 36; 428/546, 548, 551, 553

[56] References Cited

U.S. PATENT DOCUMENTS

| | | | |
|---|---|---|---|
| 4,963,523 | 10/1990 | Ekin et al. | 505/1 |
| 5,015,620 | 5/1991 | Ekin et al. | 505/1 |
| 5,149,686 | 9/1992 | Ekin et al. | 505/1 |
| 5,179,071 | 1/1993 | Ekin et al. | 505/1 |
| 5,358,793 | 10/1994 | Hanada et al. | 428/560 |

OTHER PUBLICATIONS

Advanced Materials Research News, Steffen Elschner & Joachim Bock Adv. Mater. 4 1992 No. 3, pp. 242–244.
Letters to Nature, J. van der Maas, V. A. Gasparov, & D. Pavuna Nature vol. 328 13 Aug. 1987, pp. 603–604.
Applied Physics lett., J. W. Ekin, T. M. Larson, and N. F. Bergren Applied Physics lett., vol. 52, No. 21, 23, May 1988, pp. 1819–1821.
IEEE Transactions on Applied Superconductivity, K. G. Herd, B. Dorri, E. T. Laskaris, J. E. Tkaczyk and K. W. Lay vol. 3, No. 1, Mar. 1993, pp. 1667–1670.

*Primary Examiner*—Donald P. Walsh
*Assistant Examiner*—John N. Greaves
*Attorney, Agent, or Firm*—Edmond P. Anderosn; James Magee, Jr.

[57] ABSTRACT

A conductive contact for use with metal oxide superconductors is described. The conductive contact comprises a metal contact which is attached by a diffusion bonding means to a superconductive metal oxide substrate. In a preferred embodiment, diffusion bonding means comprises a metal paint which includes metal particles and an organic binder which is heated to pyrolized the organic binder and form metallic diffusion bonds to the metal contact and metal oxide substrate. The invention also comprises a method for forming the conductive contact which includes selecting the superconducting metal oxide substrate, coating the substrate with a metal paint, placing the metal contact in touching contact with the metal paint and heating the combination of materials described above to pyrolized the organic binder and coalesce the metal particles.

12 Claims, 3 Drawing Sheets

5,480,728

1

LOW RESISTANCE ELECTRICAL CONTACT FOR OXIDE SUPERCONDUCTORS AND A METHOD FOR MAKING

BACKGROUND OF THE INVENTION

The present invention is directed to low resistance electrical contacts on metal oxide superconductors and a method for making such contacts.

In order to make commercial use of superconductive materials, particularly metal oxide superconductors such as $YBa_2Cu_3O_z$(YBCO) and $Bi_2Sr_2CaCu_2O_z$ (Bi(2212)), it is necessary to make electrical connections to other electrically conductive materials, such as wires and other electrical components, including other superconductive materials. It is desirable that such electrical contacts be compatible with known methods for interconnecting electrically conductive materials and components, such as soldering, welding, wire-bonding and other interconnection methods. In the past, efforts have been made to form conductive contacts on metal oxide superconductors using various noble metals such as Ag, Au and Pt, however, the methods employed have produced limited success.

One method of forming such contacts has employed physical vapor deposition such as sputtering or evaporation to deposit a metal contact directly on a metal oxide surface. Electrical contacts formed using this method have shown poor solderability in tests conducted by Applicant. It is believed that such solderability problems are related to the thickness of the metal contacts deposited using physical vapor deposition techniques which were typically on the order of 0.1 to 1 microns. Thicker contacts may be obtained using physical vapor deposition techniques, but deposition of thicker noble metal films using these techniques may not be desirable due to the length of the deposition times required to deposit thicker metal contacts, as well as the inefficient use of the noble metal deposition materials, in that a significant portion of the starting material used for deposition is deposited on the walls of the deposition chambers used when employing these techniques. In addition, physical vapor deposition techniques such as sputtering or evaporation typically require masking of the substrate material, in order to limit the deposition of the contact material to the area of interest on the metal oxide material.

Another technique for forming metal contacts on metal oxide superconductors has employed the use of silver paint or paste, such as conductive epoxy materials which utilize conductive metal particles suspended in an organic resinous matrix. Such materials can be employed using several methods. One method involves the use of an appropriate hardener to harden the resinous matrix and thus form an electrical contact. Such contacts are known to have higher electrical resistivity than pure metal contacts due the higher resistivity of the organic matrix. A second method is to apply the metal filled resin (without the hardener) as a silver paint or paste in an area of a metal oxide where an electrical contact is desired, and then pyrolize the resin to remove the organic binder leaving a metal contact, such as a silver contact. Applicants have also observed solderability limitations with painted contacts as described above. Namely, when the painted contacts were thin (e.g. relatively few coats) the contacts exhibited solderability problems, and when the painted contacts were thicker (e.g. a plurality of coats of silver paint) the contacts exhibited a propensity to fall off, particularly when exposed to thermal cycling such as encountered during a soldering process.

2

Yet another related art technique for producing metal contacts on metal oxide superconductors has involved forming the contact into the body of the metal oxide during its fabrication, such as by casting the metal oxide into a mold containing a preform of the desired electrical contact. See Elschner and Bock, Advanced Materials Vol. 4 No. 3, 1992, pp. 242–244. However, one problem observed using this technique is that after a required annealing step to form the metal oxide superconductor, there was no electrical continuity between the contact and the metal oxide. Subsequent annealing steps can be employed to affect the continuity of the contact and produce a relatively low specific surface resistivity between the contact and the metal oxide superconductor on the order of 2.5 $\mu\Omega\text{-cm}^2$. However, casting is not a desirable method for forming all metal oxide superconductors of interest, and the subsequent anneal adds an additional process step and therefore additional cost to produce these contacts. Also, there is concern about the susceptibility of such contacts to failure by separation of the metal/metal oxide interface due to the thermal expansion mismatch of these materials, especially during subsequent electrical interconnection operations or in a cyclic thermal environment.

SUMMARY OF THE INVENTION

The present invention describes a new type of an electrical contact for a metal oxide superconductor, and a method for making such electrical contact.

The contact comprises a metal contact, such as a metal foil, which is attached to a metal oxide superconductor by the diffusion bonding of a pyrolized metal paste or paint. In the method of the invention, the metal paste or paint, comprising metal particles and an organic binder, is applied to a portion of the metal oxide superconductor. A metal contact such as a metal foil is then placed in touching contact with the metal paint. The assembly of these materials is heated in an oxidizing atmosphere to pyrolize the organic binder contained within the metal paint. In the course of pyrolizing the organic binder, metal particles contained within the metal paint coalesce into an at least semi-continuous intermediate layer, while additional portions of these metal particles diffuse into both the metal contact and the metal oxide. The result is that the metal contact strongly adheres to the metal oxide via the intermediate layer, and at the same time, the combination of the metal contact and the intermediate layer formed by the coalesced metal particles forms an ohmic electrical contact with the metal oxide superconductor which has a specific contact resistivity of less than 10 $\mu\Omega\text{-cm}^2$.

Therefore, a principle object of the present invention is to form an ohmic metal contact having a low specific contact resistivity with a metal oxide superconductor.

A second object of the present invention is the definition of a method for forming ohmic metal contacts with metal oxide superconductors.

DETAILED DESCRIPTION OF THE INVENTION

The present invention is directed toward the creation of metal electrical contacts on metal oxide ceramics, particularly superconducting metal oxide ceramics, having a low specific surface resistivity. In this context, specific surface resistivity refers to the resistivity of the contact at the interface between the metal oxide and the intermediate layer directly adjacent to the metal oxide. The purpose of seeking low specific surface resistivity is to reduce resistive losses and heating in use due to interconnections with other electrical materials and components. The invention also encompasses a method for forming such electrical contacts on metal oxide ceramics, particularly superconducting metal oxide ceramics.

Figure 1:
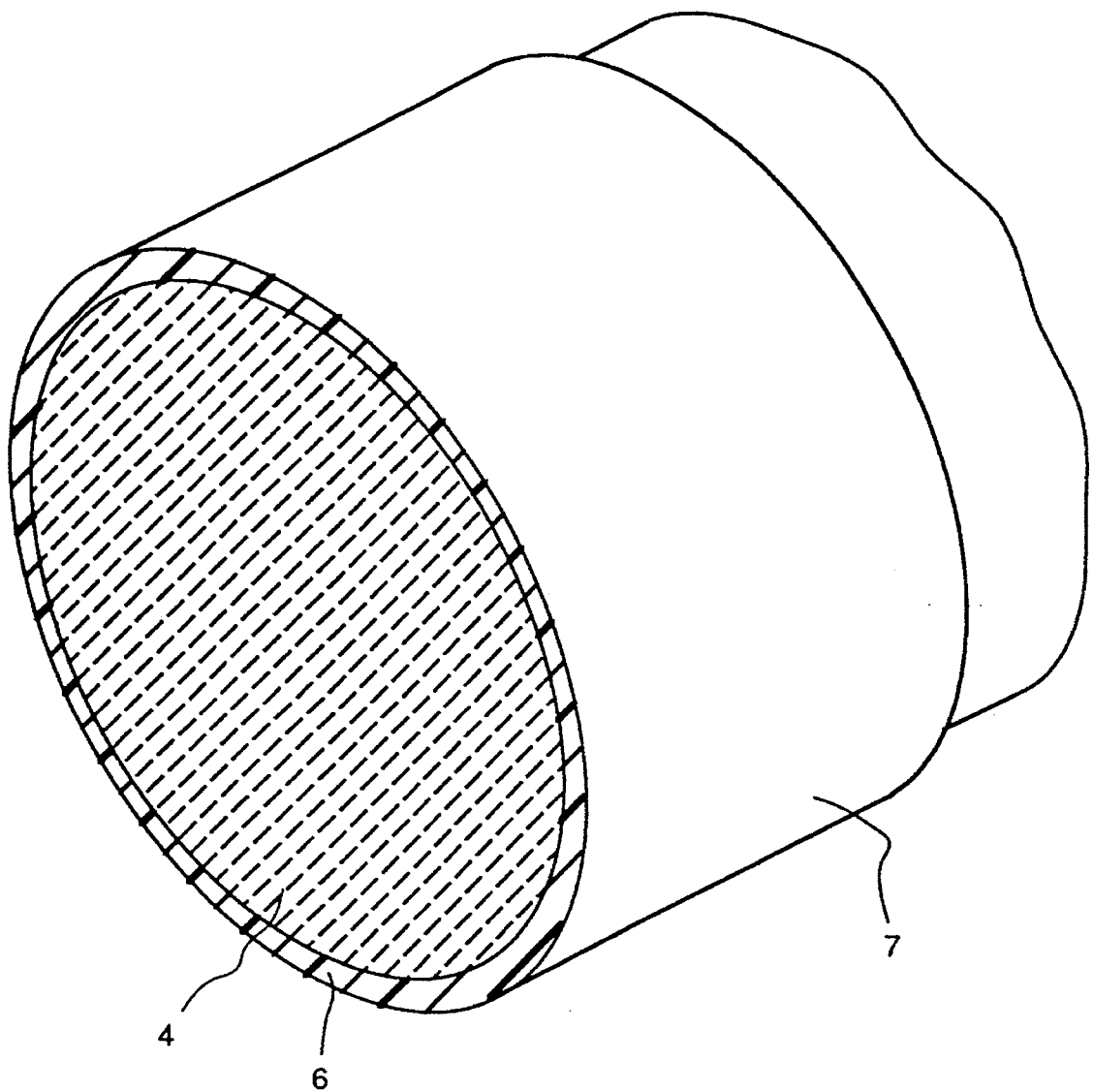
FIG. 1 is an isometric view of the end of a metal oxide superconductor which has been coated with a metal paint, with sectioning on the end to illustrate the materials used.

Referring now to FIG. 1, the method of forming electrical contacts on metal oxides is described. The method begins by selecting a metal oxide substrate 4. Metal oxide substrate 4 is preferably a superconducting metal oxide from the group consisting of $MBa_2Cu_3O_z$ and $Bi_2Sr_2CaCu_2O_8$, where M is an element from the group consisting of Y, Nd, Pm, Sm, Eu, Gd, Tb, Dy, Ho, Er, Tm, Yb and Lu, and Z is in the range from 6.5 to 7.0, but most preferably 7. Applicant believes that other metal oxides may also work as metal oxide substrate 4 in the method of the present invention, but other metal oxide substrates have not been demonstrated.

After selecting metal oxide substrate 4, the next step of the method of the present invention is coating portion 7 of metal oxide substrate 4 with metal paint 6. Metal paint 6 comprises metal particles and an organic binder neither of which are illustrated. Metal paint 6 must have an appropriate viscosity, wetting characteristics and other properties necessary to coat portion 7. In a preferred embodiment, metal paint 6 comprises silver particles and an organic binder such as found in TRA-DUCT 2902 resin manufactured by TRA-CON Inc. This material is the resin base for a two part conductive epoxy adhesive, and contains silver particles suspended in a resin mixture based on 4,4'-isopropylidenediphenol epichlorohydrin resin (CAS#'s25068-38-6 and/or 3101-60-8) and or similar isomers, as well as a small amount of aromatic glycidyl ether (CAS#2210-79-9). The constituents comprise approximately 70–90 volume percent silver powder, 10–30 percent by volume of the resin and less than 15 percent by volume of ether. Applicant believes that other metal particles may be used in metal paint 6, particularly those of other noble metals including Au and Pt. Applicant also believes that other organic binder systems may be used, so long as they may be pyrolyzed without producing nonconductive reaction products.

Figure 2:
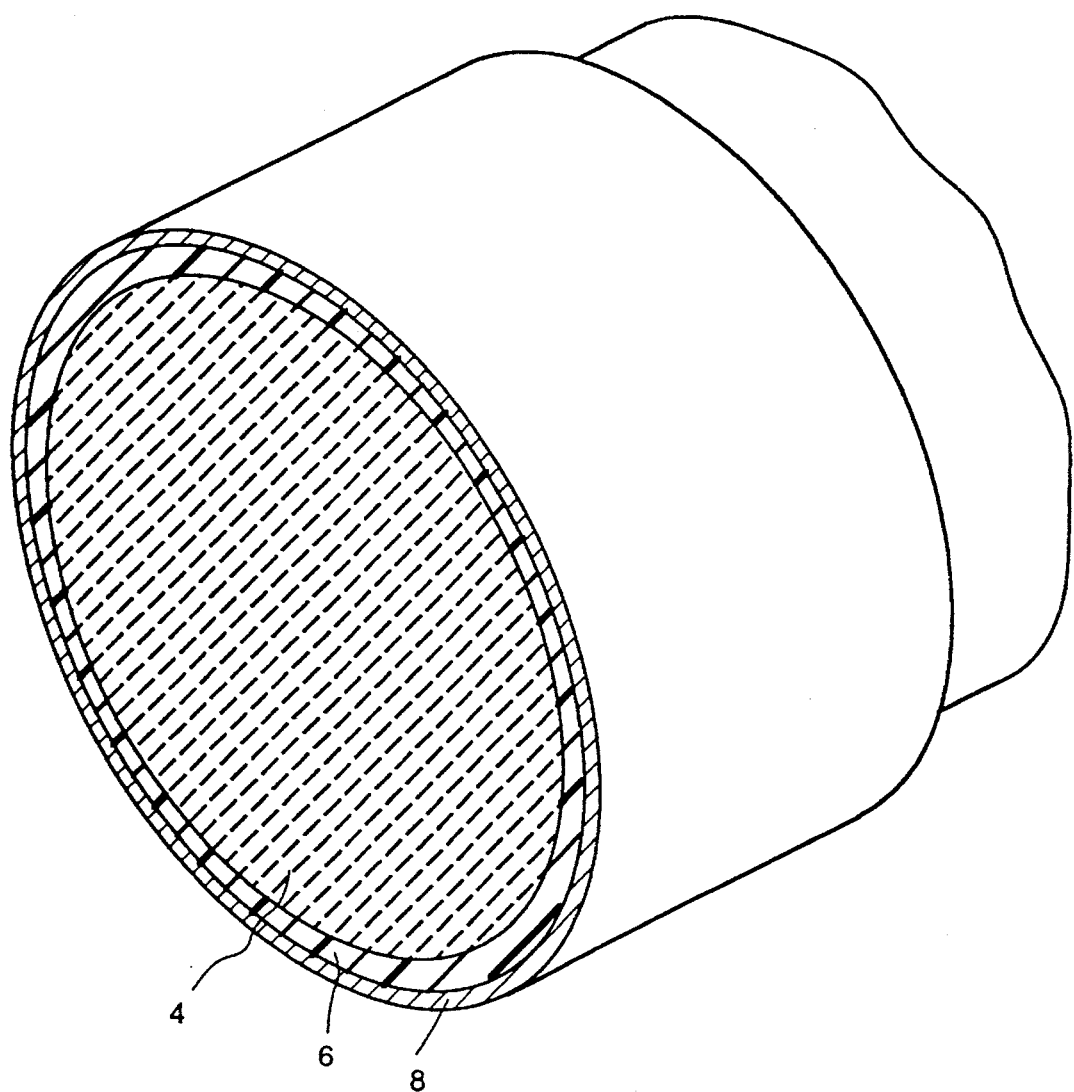
FIG. 2 is an isometric view of the apparatus of FIG. 1 which has further been wrapped with a metal contact, also including sectioning on the end to illustrate the materials used.

Referring now to FIG. 2 the next step in the method of the present invention is to place metal contact 8 in touching contact with metal paint 6 over portion 7, as shown in FIG. 1. In a preferred embodiment, metal contact comprises an Ag foil having a thickness on the order of 2 mils which was wrapped around metal oxide substrate 4. Metal contact 8 could also be a preformed contact, such as a cap which could be placed over the end of metal oxide substrate 4.

Figure 3:
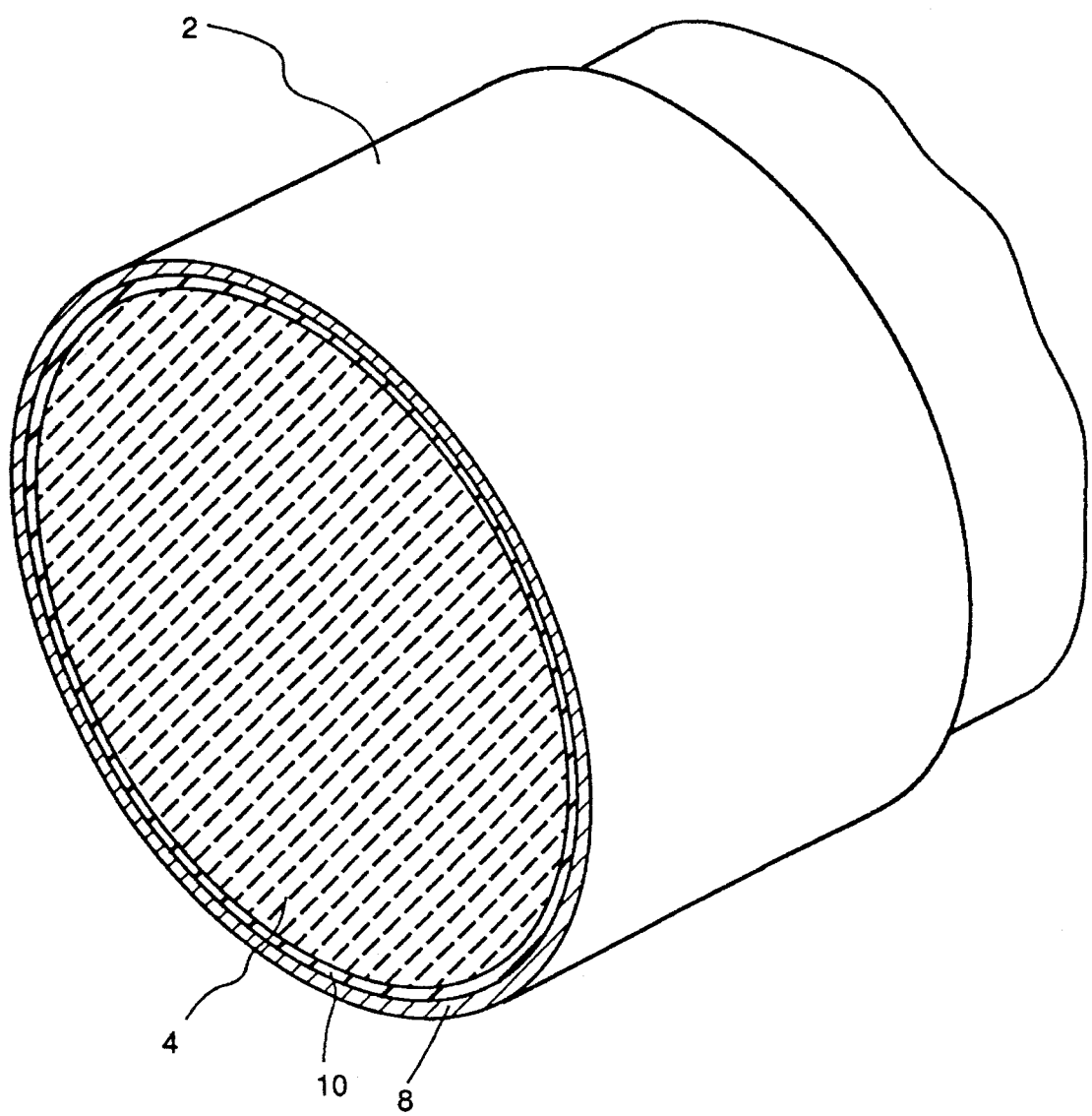
FIG. 3 is an isometric view of the apparatus of FIG. 2 after pyrolysis of the metal paint to remove the organic binder and coalesce the metal particles, and also including sectioning on the end to illustrate the changes from FIG. 2.

The final step in the method of the present invention is not illustrated, but the resulting structure is shown is FIG. 3, and comprises heating the combination of metal oxide substrate 4, metal paint 6 and metal contact 8 in oxygen or another appropriate oxidizing atmosphere such as air at a temperature and for a time sufficient to pyrolize the organic binder material. From practical considerations, the temperature should be reasonably high on the order of 750°–950° C. to promote diffusion within a reasonable period of time. In a preferred embodiment, the heating was done in a standard laboratory resistance heated furnace under an atmosphere comprising 1 atmosphere of pure oxygen. This step of heating causes the organic binder to be removed by pyrolysis and the metal particles, such as the Ag particles of the preferred embodiment, to at least partially coalesce, and also causes material from these particles to diffuse into both metal contact 8 and metal oxide substrate 4.

The method of the present invention produces the structure shown in FIG. 3, which is that of conductive contact 2 attached to metal oxide substrate 4. Conductive contact 2 comprises metal contact 8 and means for diffusion bonding 10. Means for diffusion bonding 10 comprises an intermediate layer, between metal contact 8 and metal oxide substrate 4, of at least partially coalesced metal particles from metal paint 6, as shown in FIG. 1, which results from the heating of metal paint 6. Means for diffusion bonding 10 also has formed metallic bonds with metal oxide substrate 4 and metal contact 8 by diffusion of metal from the metal particles during the heating of said paint. The result is a strong metallic bond through the intermediate layer between metal contact 8 and metal oxide substrate 4.

The use of the method of the present invention to form metal contacts on metal oxide substrates allows the creation of metal contacts which have material thicknesses which are sufficient to promote good solderability of these contacts with other conductors.

EXAMPLE 1

In this example, metal oxide substrate 4 was a rectangular bar of $DyBa_2Cu_3O_z$ having dimensions of approximately 0.5 cm×1.0 cm×10 cm. The end of metal oxide substrate 4 was coated with metal paint 6 consisting of TRA-DUCT 2902 resin manufactured by TRA-CON Inc. The coated portion 7 consisted of the approximately 1 cm on the end of metal oxide substrate 4. The coated portion 7 was wrapped with an Ag foil having a thickness of approximately 2 mils. This combination of materials was heated under 1 atm. of oxygen at 930° C. for 8 hours. This method produced conductive contact 2 having a specific contact resistance of less than 10 $\mu\Omega\text{-cm}^2$. This measurement was achieved using a three point resistance measurement to set the upper bound on the resistance, where two voltage contacts are employed, one on the surface of metal oxide substrate 4, and the other on the surface of metal contact 8. Metal oxide substrate 4 was superconducting at the time of the measurement at a temperature of 77° K., with an applied current density of approximately 10 A/cm².

EXAMPLE 2

In this example, metal oxide substrate 4 comprised a rectangular bar of Bi(2212) of similar dimensions as the substrate of Example 1. The same conductive epoxy resin was used as metal paint 6 to coat a similar portion 7 on this bar. Portion 7 was wrapped with the same thickness of Ag foil. This combination was heated under 1 atm. of oxygen at 830° C. for 8 hours. The lower temperature was used due to the lower melting temperature of the Bi(2212) used in this example. Again, the specific contact resistance, measured in the same manner as in Example 1, was less than 10 $\mu\Omega\text{-cm}^2$.

What is claimed is:

1. A conductive contact for a superconductive metal oxide substrate, comprising:

a superconductive metal oxide substrate;

a metal contact; and an intermediate metal layer formed from a pyrolized metal paint that is metallurgically bonded to and joins said substrate and said metal contact, wherein said metal contact and said intermediate metal layer together form an ohmic electrical contact on said substrate.

2. The conductive contact of claim 1, wherein said superconductive metal oxide is selected from the group consisting of $MBa_2Cu_3O_z$ and $Bi_2Sr_2CaCu_2O_8$, where M is an element from the group consisting of Y, Nd, Pm, Sm, Eu, Gd, Tb, Dy, Ho, Er, Tm, Yb and Lu, and Z is in the range from 6.5 to 7.0.

3. The conductive contact of claim 1, wherein said metal contact is an Ag contact.

4. The conductive contact of claim 1, wherein said intermediate metal layer is an Ag layer, and wherein the pyrolized metal paint comprises coalesced Ag particles.

5. A conductive contact for a superconductive metal oxide substrate, comprising:

a superconductive metal oxide substrate from the group consisting of $MBa_2Cu_3O_z$ and $Bi_2Sr_2CaCu_2O_8$, where M is an element from the group consisting of Y, Nd, Pm, Sm, Eu, Gd, Tb, Dy, Ho, Er, Tm, Yb and Lu, and Z is in the range from 6.5 to 7.0;

a metal contact; and a means for diffusion bonding joining said metal contact and said metal oxide substrate, said means for diffusion bonding comprising an intermediate metal interface layer which has been formed by heating a metal paint comprising a plurality of metal particles and an organic binder to pyrolize the organic binder, coalesce the metal particles and cause diffusion between the metal particles and said metal oxide substrate and said metal contact, wherein said metal contact and the intermediate metal layer together form an ohmic electrical contact on said metal oxide substrate.

6. A conductive contact for a superconductive metal oxide substrate, comprising:

a superconductive metal oxide substrate from the group consisting of $MBa_2Cu_3O_z$ and $Bi_2Sr_2CaCu_2O_8$, where M is an element from the group consisting of Y, Nd, Pm, Sm, Eu, Gd, Tb, Dy, Ho, Er, Tm, Yb and Lu, and Z is in the range from 6.5 to 7.0;

an Ag contact; and an Ag intermediate layer between said metal oxide substrate and said Ag contact which is diffusion bonded to said metal oxide substrate and said Ag contact layer.

7. A method for forming a conductive metal contact on a superconductive metal oxide substrate, comprising the steps of:

selecting a superconductive metal oxide substrate;

coating a portion of the metal oxide substrate with a metal paint comprising a mixture of a plurality of metal particles and an organic binder;

placing a metal contact in touching contact with the metal paint; and heating the combination of the metal oxide substrate, metal paint and metal contact in an oxidizing atmosphere at a temperature and for a time sufficient to pyrolize the organic binder and cause the metal particles to at least partially coalesce and diffuse into both the metal contact and the metal oxide substrate.

8. The method of claim 7, wherein the superconductive metal oxide is from the group consisting of $MBa_2Cu_3O_z$ and $Bi_2Sr_2CaCu_2O_8$, where M is an element from the group consisting of Y, Nd, Pm, Sm, Eu, Gd, Tb, Dy, Ho, Er, Tm, Yb and Lu, and Z is in the range from 6.5 to 7.0.

9. The method of claim 7, wherein the metal paint comprises Ag particles and an organic binder.

10. The method of claim 7, wherein the metal contact is an Ag foil.

11. The method of claim 10, wherein the step of placing the Ag foil in touching contact with the metal paint comprises wrapping the Ag foil over the metal paint.

12. A method for forming a conductive metal contact on a metal oxide superconductor, comprising the steps of:

selecting a substrate from the group consisting of $MBa_2Cu_3O_z$ and $Bi_2Sr_2CaCu_2O_8$, where M is an element from the group consisting of Y, Nd, Pm, Sm, Eu, Gd, Tb, Dy, Ho, Er, Tm, Yb and Lu, and Z is in the range from 6.5 to 7.0;

coating a portion of the substrate with an Ag paint comprising a mixture of a plurality of Ag particles and an organic binder;

placing an Ag contact in touching contact with the Ag paint; and heating the combination of the substrate, Ag paint and Ag contact in oxygen at a temperature and for a time sufficient to pyrolize the organic binder and cause the Ag particles to at least partially coalesce and to diffuse into both the Ag contact and the metal oxide substrate.

* * * * *